United States Patent
Matsuzaki

[11] Patent Number: 5,258,932
[45] Date of Patent: Nov. 2, 1993

[54] PLA SIMULATION METHOD

[75] Inventor: Kazuhiro Matsuzaki, Kawasaki, Japan

[73] Assignee: Fujitsu Limited, Kanagawa, Japan

[21] Appl. No.: 759,368

[22] Filed: Sep. 13, 1991

[30] Foreign Application Priority Data
Sep. 14, 1990 [JP] Japan .................... 2-242614

[51] Int. Cl.⁵ .............. G06F 15/60; H03K 19/177
[52] U.S. Cl. ................... 364/578; 364/488
[58] Field of Search .......... 364/488, 489, 578; 371/23

[56] References Cited
U.S. PATENT DOCUMENTS

| | | | |
|---|---|---|---|
| 3,377,471 | 4/1968 | Althaus et al. | 364/578 |
| 3,702,003 | 10/1972 | Ramirez, Jr. et al. | 364/578 |
| 5,051,938 | 9/1991 | Hyduke | 364/578 |
| 5,051,941 | 9/1991 | Takamine et al. | 364/578 |
| 5,053,980 | 10/1991 | Kanazawa | 364/578 |

FOREIGN PATENT DOCUMENTS
147236 9/1983 Japan.

Primary Examiner—Vincent N. Trans
Attorney, Agent, or Firm—Armstrong, Westerman, Hattori, McLeland & Naughton

[57] ABSTRACT

In logical simulation, required data amounts to a large volume when PLAs are used for circuit design. The present invention compresses PLA data for use in logical simulation and reduce necessary data volume. According to the PLA simulation method, PLA data are compressed by using at least one multiple input/output PLA and the output of the PLA is simulated according to the compressed data.

10 Claims, 6 Drawing Sheets

PLA SIMULATION METHOD

BACKGROUND OF THE INVENTION

The present invention relates to a logic simulation method, and more specifically to a program logic array (PLA) simulation method for minimizing the required data volume used for PLA logical simulation, thus improving the efficiency of a simulation process.

A PLA is a digital circuit module for obtaining as much various output data as desired by a user according to the combination of numerous input data.

FIG. 1 shows an explanatory view of a 4-input-to-2-output PLA. By applying input data (a0, a1, a2, and a3) through a number of pins, output data (b0 and b1) are obtained from output pins according to the combination of the values of the input data.

The relationship between the input data array and the output data array can be shown in a table referred to as "PLA data" (FIG. 1B). In the PLA data, for example, when the values in the input data array (a0, a1, a2, a3) are (0, 0, 0, 0), the resultant output (1, 0) is obtained in the output data array (b0, b1). Or, for example, when the values in the input data array are (0, 0, 0, 1), the resultant output is (1, 1). Thus, output values are determined by the combination of data input to an input data array. Each PLA module has its own PLA data.

Ordinarily, in the logic simulation of a circuit, the above described PLA data are used to simulate a PLA module. That is, an output value is obtained by retrieving PLA data from each PLA module corresponding to design input data applied to a PLA module, then identifying the same input data array therein as that of design input data, thus obtaining the output corresponding to the input data array as the output value of the PLA module.

However, in the prior art technology, there is a problem in that the simulation speed slows down when PLA data are prepared on a large scale.

The scale of PLA data grows exponentially larger with the increase of the number of input data arrays. That is, when the number of input data arrays is n, the amount of PLA data is $2^n$. In the prior art technology, all PLA data are retrieved to find equivalent data in design input data and PLA data where values in the respective input data arrays match. Therefore, there can be a large number of input data arrays and large amounts of PLA data, thus increasing the time needed to retrieve PLA data which also reduces simulation speed.

There is another problem in that a large volume of PLA data used for the simulation process occupies greater amounts of memory capacity, thus limiting analysis of the circuit to be used for the simulation to a smaller scale since the available data volume in a circuit's simulation process is not infinitive, but limited.

SUMMARY OF THE INVENTION

The present invention relates to a PLA simulation method for minimizing the volume of required data, thus improving the efficiency of the simulation process.

An object of the present invention is to reduce PLA data volume and improve the efficiency of logical simulation of a circuit.

A logic simulation system for designing a circuit comprises a logic simulator for simulating an output value of a PLA according to PLA data compressed by a logical compressor as a pre-processor used in logical simulation for logically compressing multiple-input-to-multiple-output PLA data.

DESCRIPTION OF THE PREFERRED EMBODIMENT

Figures 1A, 1B:
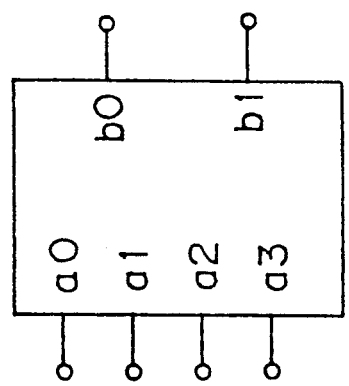
FIGS. 1A and 1B show explanatory view of a PLA.
Figure 2:
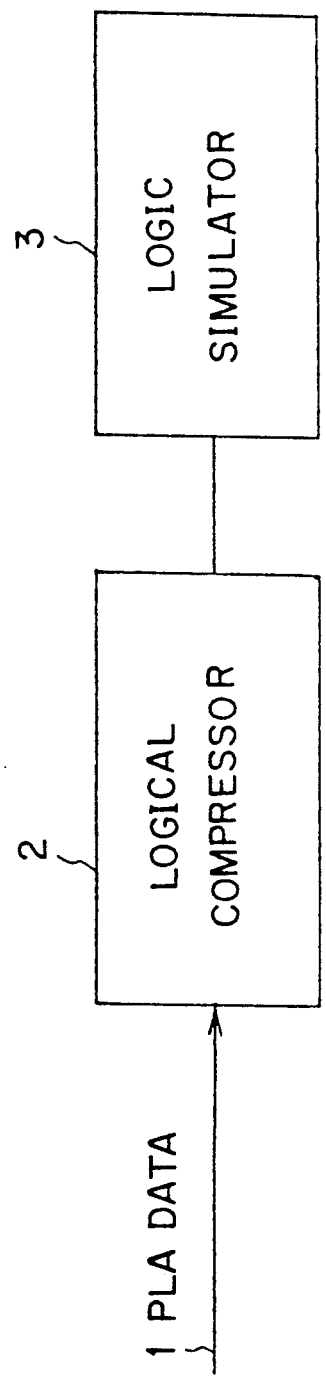
FIG. 2 shows a block diagram which illustrates the function of the present invention.

FIG. 2 shows a block diagram which illustrates the function of the present invention. The present invention relates to logic simulation for a PLA in, for example, logic simulation of a circuit design.

A logical compressor 2 for compressing the data volume of PLA data 1 extracts from PLA data 1 a group of data 'on cover' each having a value of 1 in an output array; a group of data 'off cover' each has a value of 0 in an output array. Since 'on cover' and 'off cover' are smaller scale data groups than the original PLA data, the data in these groups can be compressed.

Either 'on cover' or 'off cover' can be referred to as PLA data, whichever comprises smaller volume of data. In this case, data can be compressed even further into a smaller volume.

A logic simulator 3 performs logic simulation according to the resultant PLA data compressed by the logical compressor 2, obtaining the same simulation result as that obtained from the whole PLA data.

The logic simulator 3 determines whether design input data to be applied to a PLA module are contained in a data group compressed by the logical compressor; they cross each other; design input data contain a group of compressed data; or design input data are not associated with a compressed data group. That is, if data, after checked in a compressed data group, are contained in a compressed data group, and contain only values of a compressed data group, they are determined as being contained in a compressed data group. If, on the other hand, data are contained in a compressed data group, but contain values other than those of a compressed data group, they are determined as crossing a compressed data group. Further, if all data in a compressed data group are contained in input data, the compressed data group is determined as being contained in the input data; and if input data are not contained in a compressed data group, the input data are determined as not associated with the compressed data group.

If input data are contained in an 'on cover' compressed data group, the output recognized in the compressed data group is set to 1. If input data are contained in an 'off cover' compressed data group, the output recognized in the compressed data group is set to 0. When input data crosses a compressed data group and input data contain a compressed data group, the output recognized in the compressed data group is determined as uncertain. When input data are not associated with an 'on cover' compressed data group, the output is not certain but all the output is set to 0 in the compressed data group. When input data are not associated with an 'off cover' compressed data group, all the output is set to 1 in the compressed data group.

When a user performs logic simulation of a circuit, design data are applied to a logic simulation system. Then the user inputs PLA data 1, which are expressed as design data in a table indicating the relationship between an input data array and an output data array.

Based on the design data, the logic simulation system generates a model of a circuit to be simulated, and the logic compressor 2 performs a compression process on PLA data 1.

Data, each having a value of 1 in the output data array of PLA data 1 (an input data array and an output data array pair), are extracted to form a data group. The generated data group is 'on cover' compressed PLA data. Likewise, data each having a value of 0 in the output data array of PLA data 1 (an input data array and output data array pair) are extracted to form a data group. The generated data group is 'off cover' compressed PLA data.

Select whichever has smaller volume among 'on cover' or 'off cover' compressed PLA data, and use them as PLA module data used in a circuit model to be simulated.

The above described selection is not always made after both 'on cover' and 'off cover' data groups are generated; but either of them can be predetermined for selection. In this case, however, PLA data are compressed.

A simulation model can be completed by combining the compressed PLA data in a PLA module obtained as described above and model data of other circuits. Logic simulation is then performed on this simulation model.

The logic simulator 3 provides PLA module data in the simulation model with input data, and then performs a simulation process. In this case, applicable compressed PLA data belong to either an 'on cover' data group or an 'off cover' data group.

First, it is determined whether or not input data are contained in a compressed PLA data group and then they are compared. Either input data and a compressed PLA data group are not associated, or input data contain compressed PLA data.

That is, first, it is determined whether or not data in an input data array to be applied to a PLA module are contained in a compressed PLA data group. If not, the input data are determined as being not associated with the compressed PLA data group. If yes, it is determined whether or not all data in the input data array are contained in the compressed PLA data group. If yes, the data in the input data array are determined as being contained in the compressed PLA data group. If part of the data in an input data array matches those in a compressed PLA data group and the remaining does not, it is determined whether or not the matching data includes all data in the compressed PLA data group. If not, and different data exists in the compressed PLA data group, the data in the input data array and the compressed PLA data group are determined as crossing. Finally, when any data other than matching data do not exist in a compressed PLA data group, the input data are determined as comprising a compressed PLA data group.

When input data are contained in an 'on cover' compressed PLA data group, an output value recognized in the compressed PLA data group is set to 1. When input data are contained in an 'off cover' compressed PLA data group, an output value recognized in the compressed PLA data group is set to 0. On the other hand, when input data crosses a compressed PLA data group and the input data contain the compressed PLA data, an output value recognized in the compressed PLA data is uncertain. If input data and a compressed PLA data group are not associated, an output value is not recognized in the compressed PLA data group. Then, the output value in the 'on cover' compressed PLA data group is set to 0, while that in the 'off cover' compressed PLA data group is set to 1.

The logic simulation process using a PLA module is completed according to the procedure described above.

A more detailed explanation of the present invention is given as follows and in association with FIGS. 3 through 6.

Figure 3:
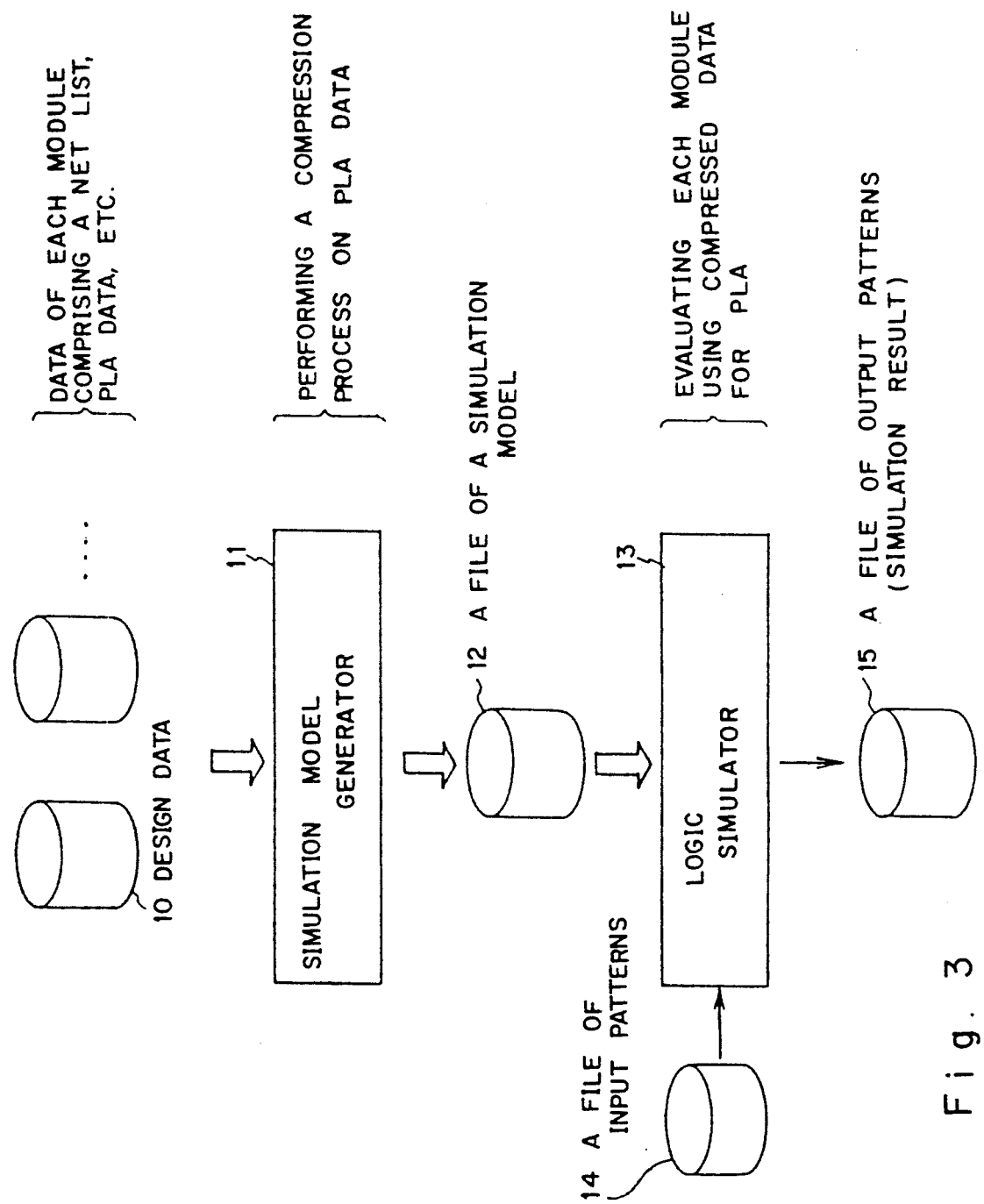
FIG. 3 shows a system configuration of an embodiment of the present invention.

FIG. 3 shows a system configuration of an embodiment of the present invention.

The embodiment comprises a simulation model generator 11 for generating a circuit model using design data 10 of a circuit to be generated by a user, a file 12 comprising a generated simulation model, a logic simulator 13 for performing logic simulation based on a simulation model read from the file 12 of a simulation model, an input pattern file 14 as input to a circuit model during logic simulation, and an output pattern file 15 for storing the logic simulation results provided by the logic simulator 13.

The design data 10 comprise a circuit net list to be generated by a user and data of each module. If a PLA is contained in a module forming the circuit, it is contained as design data. PLA data are represented in a table indicating the relationship between input data to be applied to the corresponding PLA and output data corresponding to the input data. The PLA data comprise all input data patterns for the corresponding PLA and output data in response to the input.

The design data 10 are applied to the simulation model generator 11, and have a hierarchical structure comprising a net list, detailed data in a net list, etc. The design data 10 contain PLA data and data related to a logic gate such as an AND gate, NAND gate, etc.

The simulation model generator 11 develops the hierarchical structure described above into the data structure to be applied to a simulation process. A compression process to be described later is performed on PLA data.

After PLA data are compressed and the structure of design data 10 are developed into a simulation model, the simulation model is stored in the file 12. The logical simulator 13 reads the simulation model from the file 12 and an input pattern from the input pattern file 14 to perform logical simulation.

The logic simulator 13 simulates the operation of each module on an event-dependent basis. PLA modules exist as one of various modules; each module is sequentially operated by input data on the whole simulation model. The output data from these modules are used as input data to PLA modules.

In a PLA module, simulation is conducted using input data and compressed PLA data generated by the simulation model generator 11. A detailed explanation of the PLA module is given later.

The logic simulator 13 simulates the operation of each module, and after completing the simulation of all operations of the modules involved, the output value of the whole simulation model is determined as a result of the simulation process. This simulation result is stored in an output pattern file 5.

The logic simulation of a circuit is completed using the above described procedure.

Next, the logical compression of PLA data is explained in association with an explanatory view of the logical compression in FIG. 4.

Figures 4A, 4B:
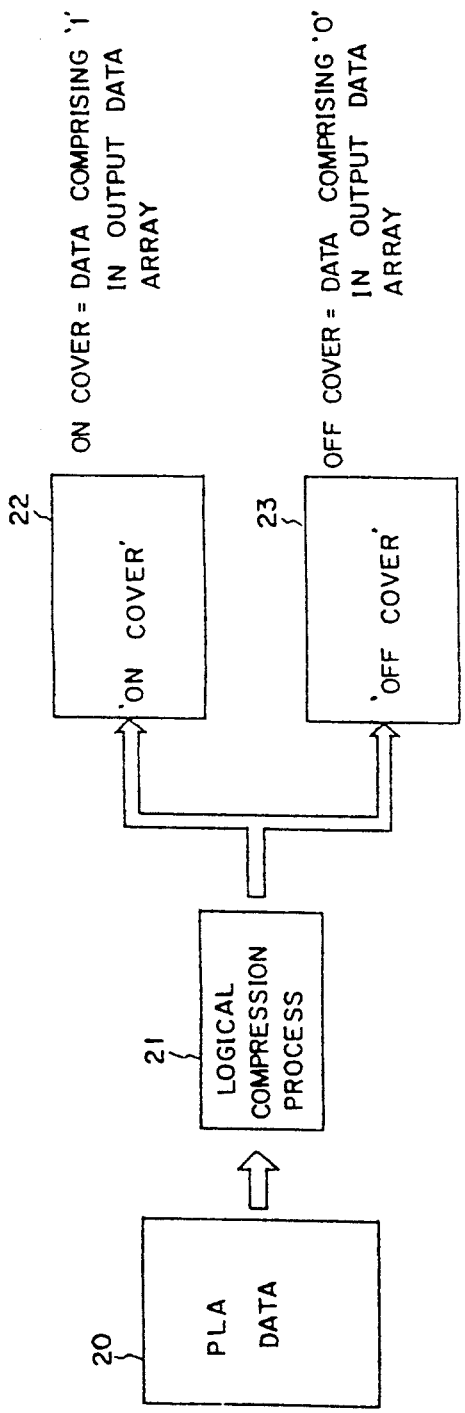
FIGS. 4A and 4B show flowcharts illustrating logical compression.

FIG. 4A shows a view for explaining a flowchart of logical compression.

PLA data 20 comprise the whole input data pattern and output data corresponding to each input data. For example, in a 4-input-to-2-output PLA module, a value of 1 or 0 may be applied to each input pin, thus involving $2^4$ groups of input data patterns. Then, output data corresponding to each of the $2^4$ groups of input data are prepared. The PLA data 20 are represented in a table comprising output data corresponding to the $2^4$ groups of input data.

A compressing process 21 is performed on the PLA data 20 to generate compressed PLA data 'on cover' 22 or 'off cover' 23.

The 'on cover' 22 is a data group where each data has a value of 1 in the output data array of a PLA module, while the 'off cover' 23 is a data group where each data has a value of 0 in the output data array of a PLA module.

When generating an 'on cover' data group 22, the logical compression process 21 first retrieves output data from the PLA data 20, and then obtains all PLA data (comprising input data and output data) each having a value of 1 in the output data. That is, in a 4-input-to-2-output PLA, a set of input data and output data each having a value of 1 in its 2-bit output (b0 and b1) is retrieved one by one. As a result, a data group of 'on cover' 22 can be obtained.

On the other hand, when an 'off cover' data group 23 is generated, the logical compression process 21 retrieves all sets of input data and output data each having a value of 0 in either bit from the output data of the PLA data 20. As a result, a data group of 'off cover' 23 can be obtained.

FIG. 4 shows an explanatory view of compressed PLA data, with an example of a compressed 'on cover' 22 data group in a 4-input-to-2-output PLA.

For example, a data set (the input data array (a0, a1, a2, a3) is (0, 0, 0, —) and the output data array (b0, b1) is (1,   )) having a value of 1 in b0 in its output data array (b0 and b1) and a data set (the input data array is (0, 1, —, —) and the output data array is (1, 1)) having a value of 1 in both b0 and b1 in its output data array are included in an 'on cover' compressed data group. The number of data sets are smaller than $2^n$ where the number of input pins is n.

In the above description '—' mean 'don't care', and '  ' means 'an output value in response to an input data is not determined as 1' (in the case of an 'on cover' data group). That is, if an input data array indicates (0, 0, 0, —), the input data can be (0, 0, 0, 0) or (0, 0, 0, 1). Likewise, if an output data array indicates (0,   ), the value in b1 of the output data array is not determined as 1.

Compressed data in an 'off cover' data group can be represented in a similar table. However, in this case, the table shows data groups each having an input data array yielding 0 in an output data array (b0, b1).

The logical compression process 21 generates either an 'on cover' data group or an 'off cover' data group to be used in logic simulation, or generates both of them and uses whichever has a smaller volume of compressed data to be used in logic simulation. In either case of an 'on cover' or 'off cover' data group, the involved data volume is smaller than that of the whole PLA data 20, thus performing logic simulation more efficiently. However, considering the higher performance of logical simulation, both an 'on cover' and 'off cover' data group should be generated first, and whichever has smaller data volume should be selected for use in logic simulation.

Figure 5:
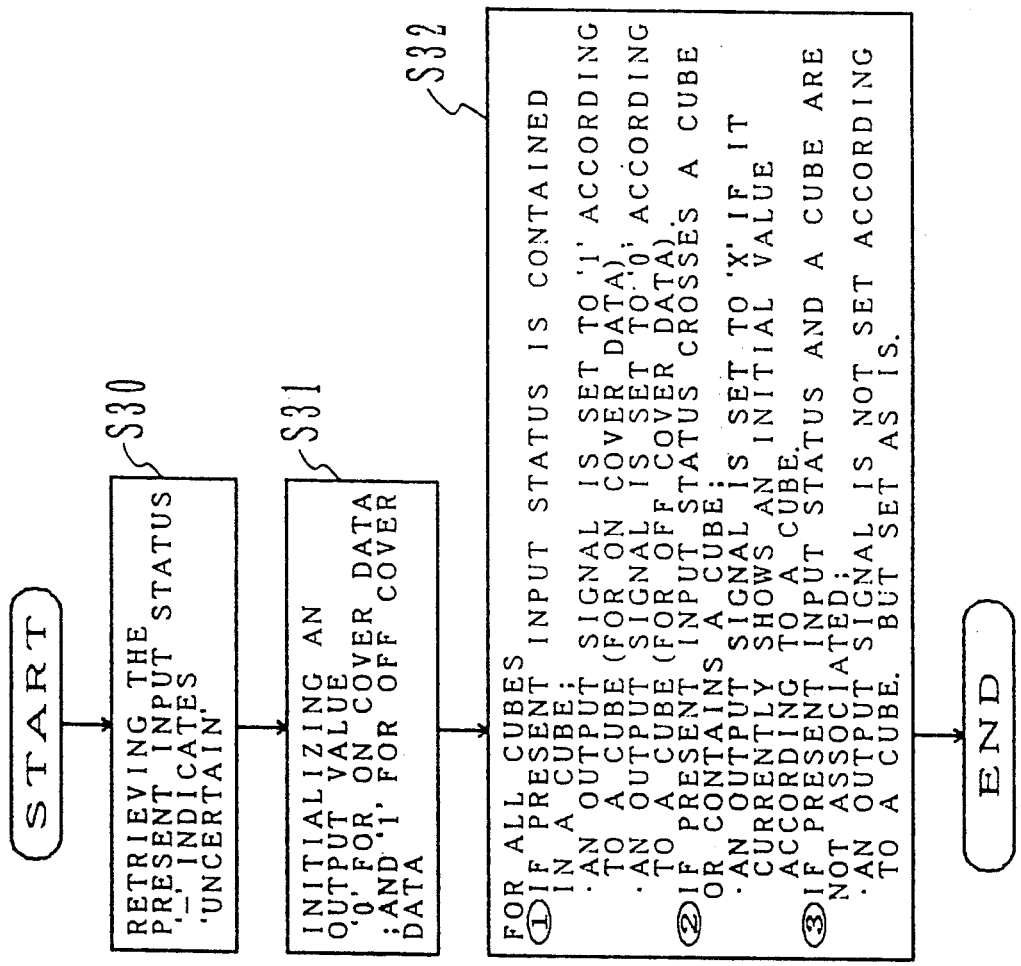
FIG. 5 shows a flowchart used in determining an output value of a PLA.
Figure 6:
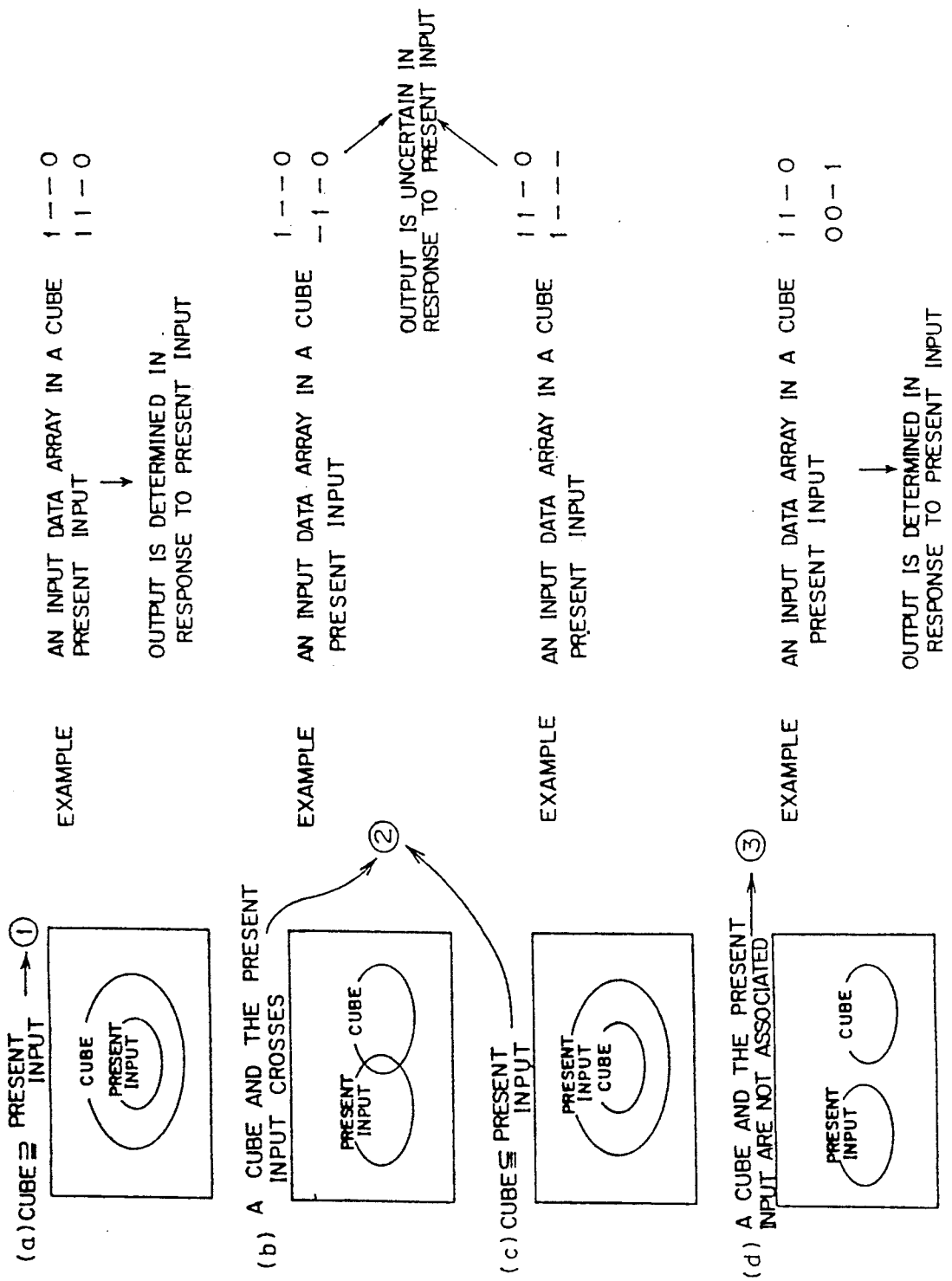
FIG. 6 shows an explanatory view of logic simulation.

The logic simulation method using compressed PLA data is explained as follows;

FIG. 5 shows a flowchart used in determining an output value of a PLA. Before starting the process, the kind of compressed data group to be used for logic simulation ('on cover' or 'off cover') should be selected.

First, input data to be applied to a PLA module are retrieved in step S30, where data comprising 0 or 1 can be indicated as '—'.

Next, an output value of the PLA module should be initialized in step S331. All output values are set to 0 when an 'on cover' data group is used, and to 1 when an 'off cover' data group is used.

When the initialization is completed in step S32, a simulation process is started where each data set (a set of data comprising an input data array and resultant output) forming compressed PLA data are referred to as a cube.

First, all cubes in compressed PLA data are retrieved to determine whether input data are contained in a cube; input data and cube data are compared. It is determined if input data contains a cube or if input data are not associated with whole cubes. The inclusive relationship between a cube group and input data is explained in association with an explanatory view of logic simulation shown in FIG. 6.

FIG. 6A is an explanatory view of 1 where input data are contained in a cube (a cube-present input). An example is: 4-input data are (1, 1, —, 0), and an input data array comprising (1, —, —, 0) is contained in a cube group. Substituting a value 1 or 0 for 'don't care' (—) yields (1, 1, 1, 0) or (1, 1, 0, 0), and the input data array in a cube can be (1, 1, 1, 0), (1, 0, 1, 0), (1, 1, 0, 0), or (1, 0, 0, 0). Thus, the input data are contained in these 4 sequences of data, which is identified as present input contained in a cube (a cube-present input).

FIG. 6B shows an explanatory view where cube data and input data cross (2). An example is: input data are (—, 1, —, 0) and an input data array of a cube is (1, —, —, 0). Substituting a value 1 or 0 for —yields input data (1, 1, 1, 0), (1, 1, 0, 0), (0, 1, 1, 0) or (0, 1, 0, 0) and input data of a cube (1, 1, 1, 0), (1, 1, 0, 0), (1, 0, 1, 0), or (1, 0, 0, 0). That is, two input data sets (1, 1, 1, 0) and (1, 1, 0, 0) are contained in cube data, but the other two data sets are not. In this case, it is determined as a cube crossing input data.

FIG. 6C shows an explanatory view where a cube is contained in input data. An example is: input data are (1, —, —, —) and an input data array indicates (1, 1, —, 0). In this case, the input data can be displayed in 8 sequences, and the cube in 2 sequences. The 2 sequence data of a cube are contained in input data. In this case, it is identified as a cube contained in input data (a cube-input data).

Finally, FIG. 7 shows an explanatory view where a cube and input data are not associated to each other (3). An example is: input data are (0, 0, —, 1) and an input data array of a cube indicates (1, 1, —, 0). Substituting 0 or 1 for 'don't care' (—) yields no equivalent data in the input data and the input data array in the cube. In this case, a cube and input data are identified as having no common relationship.

The inclusive relationship between a cube group and input data is identified as described above, and the following PLA module output is generated according to the inclusive relationship of 1, 2, and 3 (2 indicates the inclusive relation of either input data crossing a cube or a cube contained in input data).

When input data are contained in a cube as shown in 1 of FIG. 6A, an output signal is set to 1 if, according to a cube having an input data array equivalent to the input data, an 'on cover' data group is used; and an output signal is set to 0 if, according to a cube having an input data array equivalent to the input data, an 'off cover' data group is used.

If input data cross a cube or a cube is contained in input data as shown in 2 of FIGS. 6B and 6C, an output signal is set to x (uncertain) according to a cube having an input data array equivalent to the input data because the output can be either 1 or 0.

Finally, when input data and a cube are not associated 3 as shown in FIG. 6D, the output value is not determined according to the existing cube. This means that if a cube in process comprises 'on cover' data, input data match the input data array in a cube in 'off cover' data, which is thus contained in a cube in 'off cover' data. If a cube in process comprises 'off cover' data, input data match the input data array in a cube in 'on cover' data, which is thus contained in a cube in 'on cover' data. Therefore, the output value of the PLA module is provided as initialization. That is, when a cube in process comprises 'on cover' data, the output value remains set to 0; when a cube in process comprises 'off cover' data, the output value remains set to 1.

As a result of the above described procedure, logic simulation yields the same result as that generated using uncompressed PLA data 20.

Thus, the present invention realizes faster logic simulation by compressing PLA data for use in a process. As a result, logical simulation can be performed at a higher speed with largely extending the limit on a circuit scale to be used in logical simulation which has been conventionally limited to a comparatively small scale by data volume available, thus enabling logical simulation in a larger scale circuit.

What is claimed is:

1. A programmable logic array (PLA) simulation method in a logic simulation system for performing logical simulation of a circuit, comprising the steps of:
   compressing PLA data using at least one multiple input/output PLA to provide compressed data, and
   simulating an output value of said PLA according to said compressed data.

2. A PLA simulation device in a logical simulation system for performing logic simulation of a circuit; said unit comprising:
   means for compressing PLA data using at least one multiple input/output PLA and;
   a simulation means for performing logic simulation on said PLA according to the compressed data.

3. A PLA simulation device according to claim 2, wherein
   said compressed data in a multiple input/output PLA are at least one group of either those where any output among multiple output comprises 1 or those where any output among multiple output comprises 0.

4. A PLA simulation device according to claim 2, wherein
   said compressed data in a multiple input/output PLA are a data group whichever comprises smaller data volume between a group where any output among multiple output comprises 1 or a group where any output among multiple output comprises 0.

5. A PLA simulation device in a logic simulation system for designing a circuit comprising:
   a logical compression means for logically compressing data in a multiple input/output PLA as a preprocessor; and
   a logic simulation means for simulating a PLA output value according to PLA data compressed by said logic simulation means.

6. A PLA simulation device according to claim 5, wherein
   said logical compression means compresses data by extracting at least one of either a data group comprising an output value of 1 in any output data array in multiple outputs, or a data group comprising an output value of 0 in any output data array in multiple outputs.

7. A PLA simulation device according to claim 6, wherein
   said logic simulation means selects one of said data groups 'on cover' and 'off cover' extracted from PLA data whichever comprises smaller data volume.

8. A PLA simulation device according to claim 6, wherein
   said logical simulation means determines an output value of a PLA according to the compressed PLA data 'on cover' or 'off cover' extracted by said logical compression means and according to the inclusive relation ship between an input data array and PLA data.

9. A PLA simulation device according to claim 6, wherein
   said logic simulation means, when PLA data are an 'on cover' data group, sets an output value to 1 according to said 'on cover' data if input data array is contained in an 'on cover' data group; sets an output value to uncertain according to said 'on cover' data group if input data array crosses an 'on cover' data group or input data array contains an 'on cover' data group; and sets an output value to 0 if input data array is not associated with an 'on cover' data group.

10. A PLA simulation device according to claim 6, wherein
    said logic simulation means, when PLA data are an 'off cover' data group, sets an output value to 0 according to said 'off cover' data if input data array is contained in an 'off cover' data group; sets an output value to uncertain according to said 'off cover' data group if input data array crosses an 'off cover' data group or input data array contains an 'off cover' data group; and sets an output value to 1 if input data array is not associated with an 'off cover' data group.

* * * * *